(12) United States Patent
Jang et al.

(10) Patent No.: US 11,258,308 B2
(45) Date of Patent: Feb. 22, 2022

(54) SHIELDING UNIT FOR WIRELESS POWER TRANSMISSION MODULE AND WIRELESS POWER TRANSMISSION MODULE INCLUDING SAME

(71) Applicant: Amosense Co., Ltd., Cheonan-si (KR)

(72) Inventors: Kil Jae Jang, Seongnam-si (KR); Dong Hoon Lee, Yongin-si (KR); Ki Chui Kim, Incheon (KR); Jong Ho Park, Seoul (KR)

(73) Assignee: Amosense Co., Ltd., Cheonan-si (KR)

( * ) Notice: Subject to any disclaimer, the term of this patent is extended or adjusted under 35 U.S.C. 154(b) by 680 days.

(21) Appl. No.: 16/073,930

(22) PCT Filed: Feb. 2, 2017

(86) PCT No.: PCT/KR2017/001101
§ 371 (c)(1),
(2) Date: Jul. 30, 2018

(87) PCT Pub. No.: WO2017/135687
PCT Pub. Date: Aug. 10, 2017

(65) Prior Publication Data
US 2019/0044391 A1 Feb. 7, 2019

(30) Foreign Application Priority Data
Feb. 4, 2016 (KR) ........................ 10-2016-0014470

(51) Int. Cl.
*H02J 50/70* (2016.01)
*H02J 50/10* (2016.01)
(Continued)

(52) U.S. Cl.
CPC .............. *H02J 50/70* (2016.02); *H01F 27/36* (2013.01); *H01F 38/14* (2013.01); *H02J 50/10* (2016.02);
(Continued)

(58) Field of Classification Search
CPC combination set(s) only.
See application file for complete search history.

(56) References Cited

U.S. PATENT DOCUMENTS

| | | | |
|---|---|---|---|
| 2013/0005408 A1* | 1/2013 | Matsui | H01Q 1/248 455/573 |
| 2013/0135068 A1* | 5/2013 | Shih | H01F 7/0205 335/302 |

(Continued)

FOREIGN PATENT DOCUMENTS

| | | |
|---|---|---|
| KR | 10-1163574 B1 | 7/2012 |
| KR | 10-2014-0065364 A | 5/2014 |

(Continued)

OTHER PUBLICATIONS

International Search Report dated Apr. 28, 2017 for International Application No. PCT/KR2017/001101; 4 Pages.

*Primary Examiner* — Elvin G Enad
*Assistant Examiner* — Malcolm Barnes
(74) *Attorney, Agent, or Firm* — Daly Crowley Mofford & Durkee, LLP

(57) ABSTRACT

A shielding unit for a wireless power transfer module and the wireless power transfer module including the same are provided. The shielding unit for the wireless power transfer module according to an embodiment of the present invention comprises a magnetic field shielding sheet for shielding a magnetic field generated in a predetermined frequency band and condensing the same in a desired direction, and a magnetic body receiving portion which is formed through the magnetic field shielding sheet such that a magnetic body for including magnetic force lines generated from a permanent magnet can be inserted therein, wherein the magnetic body receiving portion is arranged to have a relatively larger size than the magnetic body.

2 Claims, 9 Drawing Sheets

(51) Int. Cl.
  *H01F 27/36* (2006.01)
  *H04B 5/00* (2006.01)
  *H01F 38/14* (2006.01)
  *H05K 9/00* (2006.01)

(52) U.S. Cl.
  CPC ......... *H04B 5/0037* (2013.01); *H04B 5/0081* (2013.01); *H05K 9/00* (2013.01)

(56) References Cited

U.S. PATENT DOCUMENTS

| | | | | |
|---|---|---|---|---|
| 2013/0314197 | A1* | 11/2013 | Jitaru | H01F 27/346 336/222 |
| 2014/0049212 | A1* | 2/2014 | Sawa | H02J 50/70 320/108 |
| 2014/0091758 | A1* | 4/2014 | Hidaka | H04B 5/0037 320/108 |
| 2014/0320369 | A1 | 10/2014 | Azenui et al. | |
| 2015/0116178 | A1* | 4/2015 | Kim | H02J 50/10 343/842 |
| 2015/0325362 | A1* | 11/2015 | Kumura | H01F 27/255 336/84 M |
| 2018/0198186 | A1* | 7/2018 | Hwang | H01F 27/36 |
| 2019/0097448 | A1* | 3/2019 | Partovi | H01F 38/14 |

FOREIGN PATENT DOCUMENTS

| | | | |
|---|---|---|---|
| KR | 10-2014-0102033 | A | 8/2014 |
| KR | 10-1559939 | B1 | 10/2015 |
| KR | 10-1574214 | B1 | 12/2015 |

* cited by examiner

--Prior Art--

SHIELDING UNIT FOR WIRELESS POWER TRANSMISSION MODULE AND WIRELESS POWER TRANSMISSION MODULE INCLUDING SAME

CROSS-REFERENCE TO RELATED APPLICATION

This application is a U.S. National Stage of PCT/KR2017/001101 filed in the Korean language on Feb. 2, 2017, entitled: "SHIELDING UNIT FOR WIRELESS POWER TRANSMISSION MODULE AND WIRELESS POWER TRANSMISSION MODULE INCLUDING SAME," which application claims priority to Korean Application No. 10-2016-0014470 filed on Feb. 4, 2016, which applications are hereby incorporated herein by reference in their entireties.

BACKGROUND OF THE DISCLOSURE

Field of the Disclosure

The present invention relates to wireless charging of a portable terminal and the like, and more particularly, to a shielding unit for a wireless power transfer module and the wireless power transfer module including the same, which can be applied to a wireless power transfer method employing a permanent magnet.

Description of the Related Art

A portable terminal has a wireless charging function for wirelessly charging a built-in battery. The wireless charging function is performed by a wireless power reception module built in the portable terminal and a wireless power transmission module for supplying power to the wireless power reception module.

In addition, the wireless charging may be classified into a magnetic induction type and a magnetic resonance type. In addition, the magnetic induction method may be classified into a Power Matters Alliance (PMA) standard method and a Qi standard method depending on a method of detecting the wireless power reception module accessing the wireless power transmission module.

The wireless charging method of PMA standard controls the operation of the wireless power transmission module by detecting the approach of the wireless power reception module using a permanent magnet and a hall sensor, and the concept thereof is schematically shown in FIG. 1.

As shown in FIG. 1, the permanent magnet 14 and the hall sensor 12 are installed in the wireless power transmission module 10 and a magnetic body 22 is attached in the substantially central portion of the magnetic field shielding sheet 24 in the wireless power reception module 20.

Accordingly, as the path of the magnetic force lines generated from the permanent magnet 14 is changed by the magnetic body 22 when the wireless power reception module 20 approaches the wireless power transmission module 10, the difference of voltage values at the hall sensor is generated. When the difference of voltage values becomes equal to or more than a predetermined value, the wireless power transmission module 10 recognizes that the wireless power reception module 20 is approaching. At that time, the wireless power transmission module 10 operates to perform wireless charging.

Since the magnetic body 22 is attached to a surface of the magnetic field shielding sheet 24, the magnetic force lines generated from the permanent magnet are induced to the magnetic body 22 and blocked by the magnetic field shielding sheet 24. The magnetic force line flows along the magnetic field shielding sheet 24 without flowing other sides (refer to FIG. 1).

Accordingly, when the wireless power transmission module and the wireless power reception module are close to each other, the magnetic field shielding sheet is partially or wholly magnetized by a time-invariant magnetic field, thereby deteriorating the performance of the shielding sheet or failing to function as the shielding sheet.

Particularly, as shown in FIG. 1, the magnetization due to the time-invariant magnetic field generated from the permanent magnet frequently occurs in the partial area A adjacent to the magnetic body in the entire area of the magnetic field shielding sheet.

Accordingly, in the case of an antenna disposed at a position corresponding to the area A magnetized by the time-invariant magnetic field, there is a problem that the performance is deteriorated or the normal operation is impossible and then the transmission efficiency is lowered.

Meanwhile, in order to align the wireless power transmission module and the wireless power reception module in the Qi standard method, the permanent magnet may be employed in the wireless power transmission module. That is, the permanent magnet is installed in the wireless power transmission module, and the magnetic body is attached at the substantially central portion of the magnetic field shielding sheet in the wireless power reception module. Accordingly, when the wireless power reception module is brought close to the wireless power transmission module, the permanent magnet and the magnetic body are aligned with each other through the time-invariant magnetic field generated from the permanent magnet, thereby aligning the wireless power transmission module and the wireless power reception module.

In this manner, as in the PMA standard method described above, a part or all of the magnetic field shielding sheet is magnetized by the time-invariant magnetic field generated from the permanent magnet, thereby deteriorating the performance of the shielding sheet or failing to the function as the shielding sheet smoothly. Therefore, in the case of an antenna disposed at a position corresponding to an area magnetized by the time-invariant magnetic field, there is a problem that the performance is lowered or the normal operation is impossible and then the transmission efficiency is lowered.

SUMMARY OF THE DISCLOSURE

To solve the above problems and defects, it is an object of the present invention to provide a shielding unit for wireless power transfer module and the wireless power transfer module including the same, increasing the transmission efficiency of the antenna by reducing the movement of the time-invariant magnetic field toward the magnetic field shielding sheet, by disposing the magnetic body for inducing the time-invariant magnetic field generated from the permanent magnet so as not to be in contact with the magnetic field shielding sheet, or to minimize the area where the magnetic body brought into contact with the magnetic field shielding sheet.

To solve the above problems and defects, it is another object of the present invention to provide a shielding unit for wireless power transfer module and the wireless power transfer module including the same by receiving partial or entire thickness of magnetic body in the magnetic field shielding sheet to reduce the total thickness while satisfying the charging characteristics required in the wireless charging system.

To accomplish the above and other objects of the present invention, according to aspect of the present invention, there is provided a shielding unit for wireless power transfer module, comprising: a magnetic field shielding sheet which shields a magnetic field generated in predetermined frequency band and condense the magnetic field in a desired direction; and a magnetic body receiving portion formed through the magnetic field shielding sheet so that the magnetic body for inducing magnetic force lines generated from the permanent magnet is inserted. The size of the magnetic body receiving portion may have a larger than that of the magnetic body so that a gap is formed between the side surface of the magnetic body and the inner surface of the magnetic body receiving portion when the magnetic body is inserted.

In an embodiment of the present disclosure, the magnetic field shield sheet may include a plate-type supporting member on a surface thereof, and the magnetic body may be directly attached to the supporting member.

In an embodiment of the present disclosure, the supporting member may be a heat-radiating sheet or an adhesive member having an adhesive layer formed on at least one side thereof.

In an embodiment of the present disclosure, the supporting member may be a thin metal sheet made of a metal material, and the metal sheet may include at least one pattern formed through the metal sheet.

In an embodiment of the present disclosure, the pattern may include at least one of a slit having a predetermined width and a length, and a through hole having a predetermined area.

In an embodiment of the present disclosure, the gap may be formed entirely or partially along the circumferential direction of the magnetic body.

In an embodiment of the present disclosure, the magnetic body receiving portion may be formed to have a larger cross-sectional area than the cross-sectional area of the permanent magnet.

In an embodiment of the present disclosure, the magnetic body may be a separate piece separated from the magnetic field shielding sheet by a punching process to form the magnetic body receiving portion.

To accomplish the above and other objects of the present invention, according to aspect of the present invention, there is provided a wireless power transfer module, comprising; an antenna unit including at least one antenna operating in a predetermined frequency band; a magnetic field shielding sheet for shielding a magnetic field generated by a wireless signal getting out from the antenna unit and condense the magnetic field in a desired direction, and a magnetic body receiving portion formed through the magnetic field shielding sheet so that the magnetic body for inducing magnetic force lines generated from the permanent magnet is inserted. The size of magnetic body receiving portion may have a larger size than that of the magnetic body so that a gap is formed between the side surface of the magnetic body and the inner surface of the magnetic body receiving portion.

In an embodiment of the present disclosure, the antenna unit may be a combo type including at least two antennas among a Wireless Power Transmission (WPT), a Near Field communication (NFC) antenna, and a Magnetic Security Transmission (MST) antenna.

In addition, the present invention may provide a wirelessly chargeable portable terminal in which the wireless power transfer module is installed in a rear case or a back cover of the portable terminal, operating as a wireless power reception module.

According to the present invention, the time-invariant magnetic field generated from the permanent magnet is induced and discharged to the outside, thereby reducing the amount of the time-invariant magnetic field flowing into the magnetic field shielding sheet, thereby preventing magnetization of the magnetic field shielding shield sheet and improving charging efficiency.

Further, since a part or whole thickness of the magnetic body may be received in the magnetic field shielding sheet, it is possible to use the magnetic body of sufficient thickness without increasing the overall thickness of the wireless power transfer module. Accordingly, even if the wireless power transmission module and the wireless power reception module are designed to be thin, all the conditions and characteristics required in the wireless charging method may be satisfied. Accordingly, it is possible to efficiently apply to a portable terminal having a small size.

DETAILED DESCRIPTION OF THE DISCLOSURE

The above and other objects, features, and advantages of the present invention can be appreciated by the following description and will be understood more clearly by embodiment of the present invention. In addition, it will be appreciated that the objects and advantages of the present invention will be easily realized by means shown in the appended patent claims, and combinations thereof. Accordingly, the technical spirit of the present invention can be easily implemented by an ordinary skill in the art.

The wireless power transfer module 100 or 200 according to an embodiment of the present invention may include at least one antenna 111, 112, or 113, a shielding unit 120, and a magnetic body 130 as shown in FIGS. 2 to 5.

Figure 9:
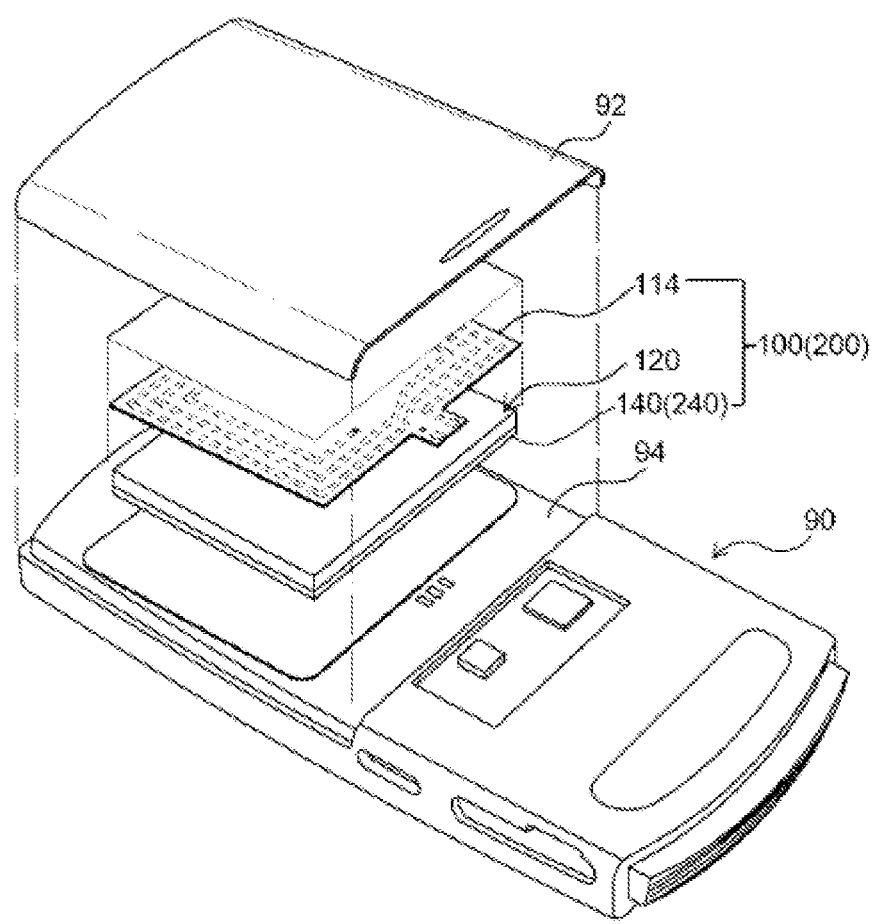
FIG. 9 is a schematic view showing a state in which the wireless power transfer module according to an embodiment of the present invention is embedded in a portable terminal.

As shown in FIG. 9, the wireless power transfer module 100 or 200 which is used as the wireless power reception module may be built in a portable terminal 90 such as a smart phone and are electrically connected to a battery to receive wireless power supplied from the wireless power transmission module 10 to charge. The wireless power transfer module 100 or 200 may be incorporated in the main body of the portable terminal 90 or attached to one side of the back cover 92 or the rear case 94 or may be integrated with the rear case 92 or the rear case 94.

The antennas 111, 112, and 113 transmit or receive a wireless signal to and from a portable electronic device such as a cellular phone, a PDA, a PMP, a tablet, and a multimedia device in a predetermined frequency band to perform predetermined functions.

Figure 1:
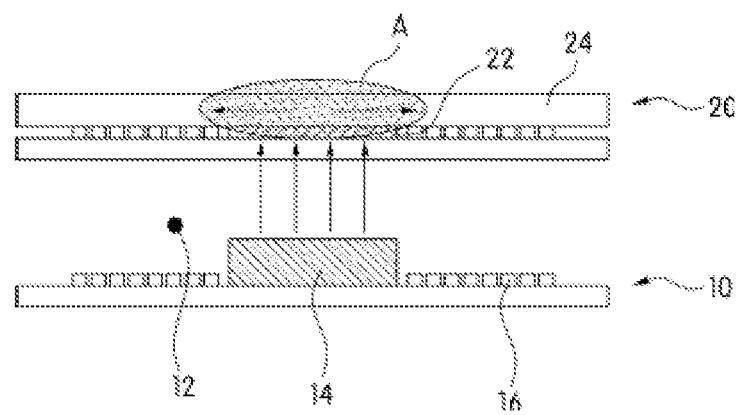
FIG. 1 is a schematic view showing a movement path of a time-invariant magnetic field generated from a permanent magnet in a wireless charging system including a permanent magnet.
Figure 2:
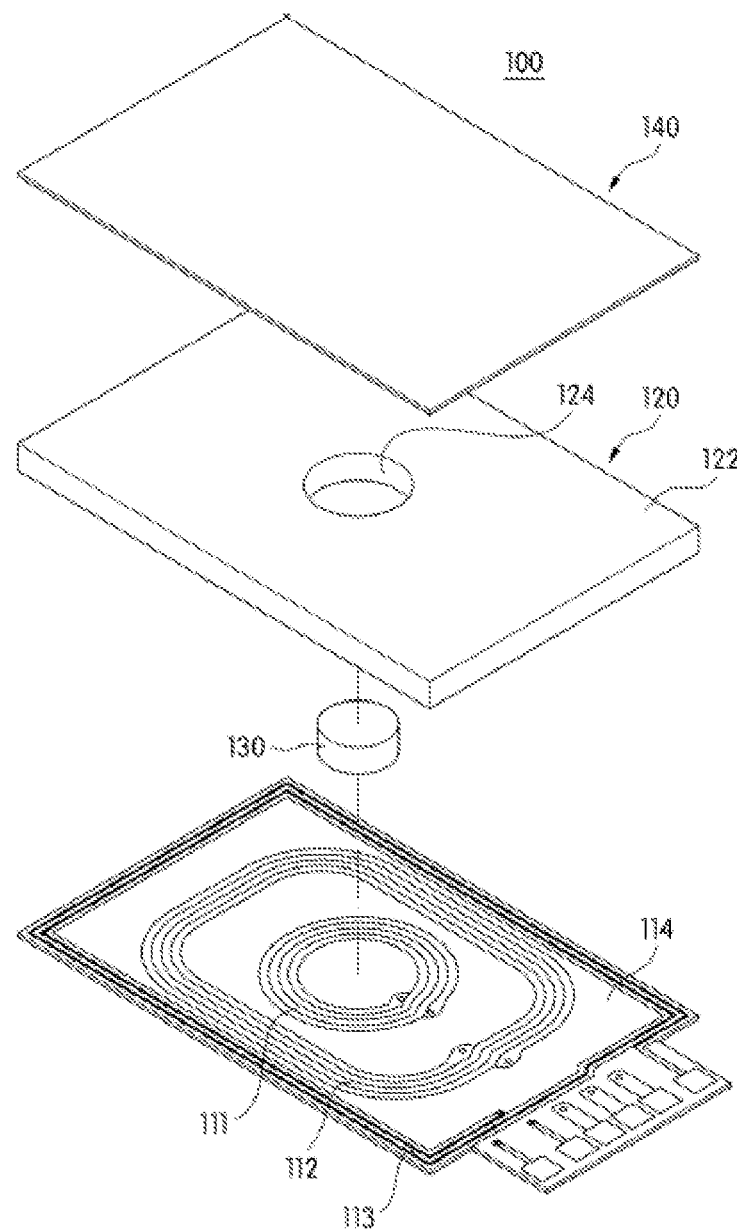
FIG. 2 is a schematic view of a magnetic field shielding unit for a wireless power transfer module and the wireless power transfer module including the same according to an embodiment of the present invention.
Figure 3:
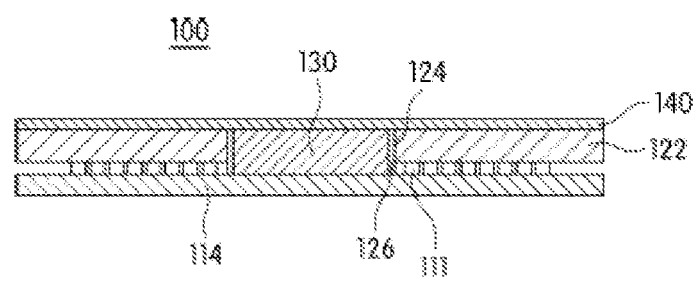
FIG. 3 is a cross-sectional view schematically illustrating the wireless power transfer module according to an embodiment of the present invention.

A radiator of a plurality of antennas 111, 112, and 113 may be formed of a flat coil wound in a clockwise direction or counterclockwise direction. The flat coil may have a circular shape, an elliptical shape, a spiral shape, or a polygonal shape such as a quadrangular shape, but the present invention is not limited thereto. As shown in FIG. 2, the antennas 111, 112 or 113 may be formed in a loop-shaped metal pattern by patterning a conductor such as a copper foil on at least one surface of a circuit board 114 made of synthetic resin such as polyimide (PI), polyethylene terephthalate (PET), or the like, or using a conductive ink.

Hereinafter, it is assumed that the antenna 111, 112, or 113 may be formed in a loop pattern on the circuit board 114 for convenience of explanation.

At this time, the antenna may include a wireless power transfer antenna 111 serving as a reception coil for receiving a wireless power signal. Further, antennas that perform other functions may be configured as well.

That is, the antenna may be composed of only the wireless power transfer antenna 111. The antenna may be configured as a combo type including at least one of a Magnetic Secure Transmission (MST) antenna 112 and a Near Field Communication (NFC) antenna 113.

The shielding unit 120 is disposed on a surface of the antenna 111, 112 or 113 to shield and condense the magnetic field generated by the wireless power signal get out from the antenna 111, 112, or 113 in a desired direction.

To this end, the shielding unit 120 may include a magnetic field shield sheet 122, a magnetic body receiving portion 124, and the like.

The magnetic field shielding sheet 122 may be a plate-like member having a predetermined area and made of a magnetic material so as to shield and condense the magnetic field in a required direction.

The magnetic field shielding sheet 122 may be made of various known materials. For example, the magnetic field shielding sheet 122 may be a ribbon sheet including at least one of an amorphous alloy and a nanocrystalline alloy, a ferrite sheet or a polymer sheet.

Here, the amorphous alloy may be a Fe-based or a Co-based magnetic alloy, and the ferrite sheet may be a sintered ferrite sheet such as Mn—Zn ferrite or Ni—Zn ferrite.

In addition, the magnetic field shielding sheet 122 may be flaked and divided into a plurality of sheets or formed of a multi-layer structure.

When the magnetic field shielding sheet 122 includes a plurality of antennas 111, 112, and 113 that perform different roles, shielding sheets made of different materials may be used to improve performance of the antennas. The different kinds of shielding sheets may be formed in a stacked form or in a frame-shape in which one of them is received in the other.

Since the magnetic field shielding sheet 122 is a known structure, a detailed description thereof will be omitted, and it is noted that the material used as the magnetic field shielding sheet may be any known material conventionally used.

In the shielding unit 120 according to the present invention, the magnetic body receiving portion 124 for receiving the magnetic body 130 may be formed through the magnetic field shielding sheet 122.

In the present invention, when the wireless power transfer module 100 or 200 approaches the wireless power transmission module 10 including the permanent magnet 14, the magnetic body 130 may serve as an attractor for inducing a difference in the voltage value in the hall sensor 12 satisfying a operating start condition of the wireless power transmission module 10 by changing the path of the magnetic force line generated from the permanent magnet 14 included in the wireless power transmission module 10.

In addition, when the wireless power reception module 20 and wireless power transmission module 10 are close, the magnetic body 130 may serve as alignment means for aligning the wireless power reception 20 module and the wireless power transmission module 10 through interaction with the permanent magnet included in the wireless power transmission module 10.

The magnetic body 130 may be inserted into the magnetic body receiving portion 124 and disposed at a position corresponding to the permanent magnet included in the wireless power transmission module 10 when aligned with the wireless power transmission module.

For example, the magnetic body 130 may be disposed at a position corresponding to the central portion of the antenna. At this time, the magnetic body 130 may have the same thickness as the magnetic field shielding sheet 122 or a relatively thicker thickness than that of the magnetic field shielding sheet 122.

In addition, the magnetic body 130 may be made of a magnetic material so as to induce a time-invariant magnetic field generated from the permanent magnet. For example, the magnetic body 130 may be a thin ribbon sheet including at least one of silicon steel (FeSi), amorphous alloy and nano-crystal alloy, and made of ferrite, permalloy, or polymer.

In addition, the magnetic body 130 may be composed of a single-layer amorphous ribbon sheet, two or more amorphous ribbon sheets laminated in multiple layers, or flaked and separated into a plurality of pieces.

At this time, the size of the magnetic body receiving portion 124 may be formed to have a larger than that of the magnetic body 130 so that the magnetic body 130 is received therein. The magnetic body 130 may be inserted into the magnetic body receiving portion 124 such that a predetermined gap 126 is formed between the side surface of the magnetic body 130 and the inner surface of the magnetic body receiving portion 124.

The gap 126 formed between the side surface of the magnetic body 130 and the inner surface magnetic body receiving portion 124 facing each other may be formed entirely or partially along the circumferential direction of the magnetic body 130.

For example, the magnetic body 130 having a relatively smaller size than the magnetic body receiving portion 124 may be disposed so as not to directly contact the inner surface of the magnetic body receiving portion 124. Some of the side surfaces of the magnetic body receiving portion 124 may be arranged so as to be in contact with the magnetic body 130 and other side surfaces may not be in contact with the magnetic body 130.

That is, at least a part of the entire side surface of the magnetic body 130 inserted into the magnetic body receiving portion 124 and faced the inner surface of the magnetic body receiving portion 124 may be in direct contact with the inner surface of the magnetic body receiving portion 124.

When the gap 126 formed between the side surface of the magnetic body 130 and the magnetic body receiving portion 124 facing each other is formed entirely along the circumferential direction of the magnetic body 130, the gap 126 may be 10 μm to 5 mm.

Accordingly, the magnetic body 130 is physically separated from the magnetic field shielding sheet 122, and the contact area may be minimized even when direct contact with the magnetic field shielding sheet 122 is intrinsically blocked or contacted. In addition, the magnetic field shielding sheet 122 is not disposed on the upper surface and the lower surface side of the magnetic body 130 except the side surface.

Accordingly, the magnetic body 130 may be physically separated from the magnetic field shielding sheet 122. In addition, direct contact with the magnetic-shielding sheet 122 may be intrinsically blocked. Even if the contact is made, the contact area may be minimized. In addition, the magnetic body shielding sheet 122 may not be disposed on the upper surface and the lower surface side of the magnetic body 130 except the side surface.

In the case where the magnetic body 130 is disposed at a position close to the upper or upper right portion of the permanent magnet 14 by approaching the wireless power transfer module 100 or 200 and the wireless power transmission module 10, the time-invariant magnetic field generated from the permanent magnet 14 may be directly emitted to the outside after the path of the magnetic flux is induced to the magnetic body 130 side. In addition, even if the time-invariant magnetic field generated from the permanent magnet directly flows into the magnetic field shielding sheet side, the amount of magnetic flux may be reduced or minimized.

Accordingly, the magnetic field shielding sheet 122 in the area surrounding the magnetic body 130 may be prevented from being magnetized by the time-invariant magnetic field generated from the permanent magnet.

The magnetic body 130 is physically separated from the magnetic field shielding sheet 122. Thus, direct contact with each other through the gap 126 is completely blocked. Even if contact is made, the contact area is minimized. The direct magnetic field induced to the magnetic body 130 side can be blocked or minimized from moving along the lateral direction of the magnetic body 130 and moving directly to the magnetic shielding sheet 122 side.

That is, conventionally, a part of the area close to the magnetic body is magnetized by the time-invariant magnetic field generated from the permanent magnet, so that the performance as the shielding sheet is deteriorated. In the present invention, it is possible to exhibit a desired shielding performance even in an area close to the magnetic body. Therefore, even if the antenna is disposed at a position close to the magnetic body, a deterioration of performance of the antenna may be prevented, and desired transmission efficiency can be obtained.

Figure 4:
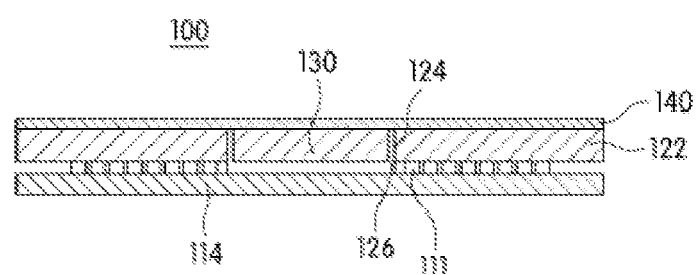
FIG. 4 is a schematic view of the wireless power transfer module according to an embodiment of the present invention, in which a magnetic body and a magnetic field shielding sheet are made of the same material.

Meanwhile, the magnetic body receiving portion 124 and the magnetic body 130 according to the present invention may be made of the same material and have the same thickness (refer to FIG. 4). For example, the magnetic field shielding sheet having a predetermined area may be punch processed by the area corresponding to the magnetic body 130 to constitute the magnetic body receiving portion 124 and use the punching process portion as the magnetic body 130.

Accordingly, by using the portion punched by the punching process as the magnetic body 130, loss of material may not occur, and cost reduction may be achieved.

In addition, when the magnetic body receiving portion 124 and the magnetic body 130 are simultaneously formed through the punching process, a gap corresponding to the thickness of the blade or the mold may be formed between the magnetic body 130 and the magnetic body receiving portion 124 at the same time by a blade or a mold used for punching process.

In addition, when the punching process is completed, the magnetic body 130 may be inserted into the magnetic body receiving portion 124 with a predetermined gap. Therefore, an additional work for inserting the magnetic body 130 into the magnetic body receiving portion 124 may be unnecessary, and work productivity may be improved.

As a specific example, the magnetic field shielding sheet made of the ribbon sheet containing at least one of an amorphous alloy and a nano-crystal alloy may be formed by a predetermined area to form the magnetic body receiving portion. The magnetic field shielding sheet and the magnetic body may have the same material and the same thickness by using the punched portion as the magnetic body for inducing the magnetic force line generated from the permanent magnet.

Meanwhile, the size of the magnetic body receiving portion 124 may be formed to have a larger than that of the permanent magnets 14 included in the wireless power transmission module 10. For example, the magnetic body receiving portion 124 may have a cross-sectional area that is relatively larger than a cross-sectional area of the permanent magnet 14.

This is because when the wireless power transfer module 100 or 200 and the wireless power transmission module 10 are disposed such that the center point of the magnetic body 130 is positioned directly above the center point of the permanent magnet 14, so that the magnetic shield sheet 122 may not be disposed immediately above the area. The magnetic body 130 or the gap 126 formed between the magnetic body 130 and the magnetic body receiving portion 124 may be disposed directly above the permanent magnet 14. Therefore, since the time-invariant magnetic field generated from the permanent magnet 14 may be minimized or prevented from being directly induced to the magnetic field shielding sheet 122, the performance of the antenna can be prevented from deteriorating and the transmission efficiency can be enhanced.

This may be confirmed in Table 1 below.

That is, the comparative example is a charging efficiency in the case where the magnetic body is attached to one surface of the shielding sheet as in the conventional method. The exemplary embodiment 1 is a charging efficiency when the magnetic body receiving portion 124 is formed to have a diameter of 19 mm and the interval between the inner surface of the magnetic body receiving portion and the side portion of the magnetic body is 1 mm. The exemplary embodiment 2 is a charging efficiency when the magnetic body receiving portion 124 is formed to have a diameter of 17 mm and the interval between the inner surface of the magnetic body receiving portion and the side portion of the magnetic body is 1 mm.

Here, in the case of the comparative example, the exemplary embodiment 1 and the exemplary embodiment 2, except for the size and formation of the magnetic body receiving portion, the wireless power transfer antenna and the magnetic field shielding sheet were measured under the same conditions.

magnetic body receiving portion 124 so as to completely cover the magnetic body receiving portion 124. Here, the supporting member 140 or 240 may be formed to have the same area as the magnetic field shielding sheet 122. The supporting member 140 or 240 may be formed to have a relatively narrow cross-sectional area than the magnetic field shielding sheet 122.

Accordingly, one side of the magnetic body 130 may be attached to the supporting member 140 or 240 while the magnetic body 130 is inserted into the magnetic body receiving 124. Accordingly, the magnetic body 130 may

TABLE 1

| Role of magnetic body | Current | Charging efficiency when the magnetic body is attached to one surface of the shielding sheet (Comparative Example) | Charging efficiency in the case of disposing the magnetic body in the magnetic body receiving portion having a diameter of 19 mm (Exemplary Example 1) | Charging efficiency in the case of disposing the magnetic body in the magnetic body receiving portion having a diameter of 17 mm (Exemplary Example 2) |
|---|---|---|---|---|
| For position alignment | 500 mA | 63.6% | 67.5% | 65.8% |
| | 600 mA | 65.6% | 69.0% | 67.9% |
| | 700 mA | 66.9% | 70.2% | 68.9% |
| | 800 mA | 67.8% | 70.5% | 69.3% |
| | 900 mA | 67.8% | 71.1% | 70.0% |
| | 1000 mA | 68.1% | 71.3% | 70.5% |
| Attractor | 500 mA | 53.7% | 55.9% | 57.7% |
| | 600 mA | 55.3% | 57.3% | 58.9% |
| | 700 mA | 56.3% | 58.2% | 60.1% |
| | 800 mA | 57.3% | 59.1% | 61.0% |
| | 900 mA | 58.2% | 59.9% | 61.9% |
| | 1000 mA | 58.7% | 60.4% | 62.5% |

As can be seen from Table 1 above, when the current of 1A used in the conventional wireless charging is applied, the charging efficiency of exemplary Embodiment 1 and 2 is more than 60% respectively. However, in the case of the comparative example, the charging efficiency is not satisfied with 60% when used as an attractor, and the charging efficiency is lower than compared to the exemplary Embodiment 1 and 2 even when used for position alignment.

The wireless power transfer module 100 or 200 according to the present invention may be configured such that the magnetic body 130 is inserted into the magnetic body receiving portion 124 formed through the magnetic field shielding sheet 122 to partially or wholly receive the magnetic body 130. Accordingly, even if the magnetic body 130 is included in the wireless power transfer module 100 or 200, the wireless power transfer module 100 or 200 may be realized in a thin form. Even if the overall thickness of the wireless power transfer module 100 or 200 is thinned, the magnetic body 130 having a sufficient thickness may be used.

In other words, even if the total thickness of the wireless power transfer module 100 or 200 is limited, the thickness of at least a part of the entire thickness of the magnetic body 130 may be received through the magnetic body receiving portion 124. Thus, it is possible to stably satisfy or implement all the conditions and characteristics required in the wireless charging system while satisfying the required thickness of the wireless power transfer module.

Meanwhile, in the shielding unit 120 according to the present invention, separate supporting member 140 or 240 may be disposed on one surface of the magnetic field shielding sheet 122.

At this time, the supporting member 140 or 240 may be plate-shaped member. The supporting member 140 or 240 may be formed to have a relatively larger area than the maintain a gap 126 spaced apart from the inner surface of the magnetic body receiving portion 124 by a predetermined distance.

At this time, the supporting member 140 may be a heat-radiating sheet for discharging the heat generated from the heat source to the outside or may be an adhesive member having an adhesive layer formed on at least one surface thereof and may be a protective film for protecting the magnetic field shielding sheet 122 from the external environment.

For example, the supporting member 140 may be a heat-radiating sheet made of a material such as graphite having a good thermal conductivity, a known double-sided tape or a single-sided tape, or a fluororesin-based protective film such as PET.

Figure 5:
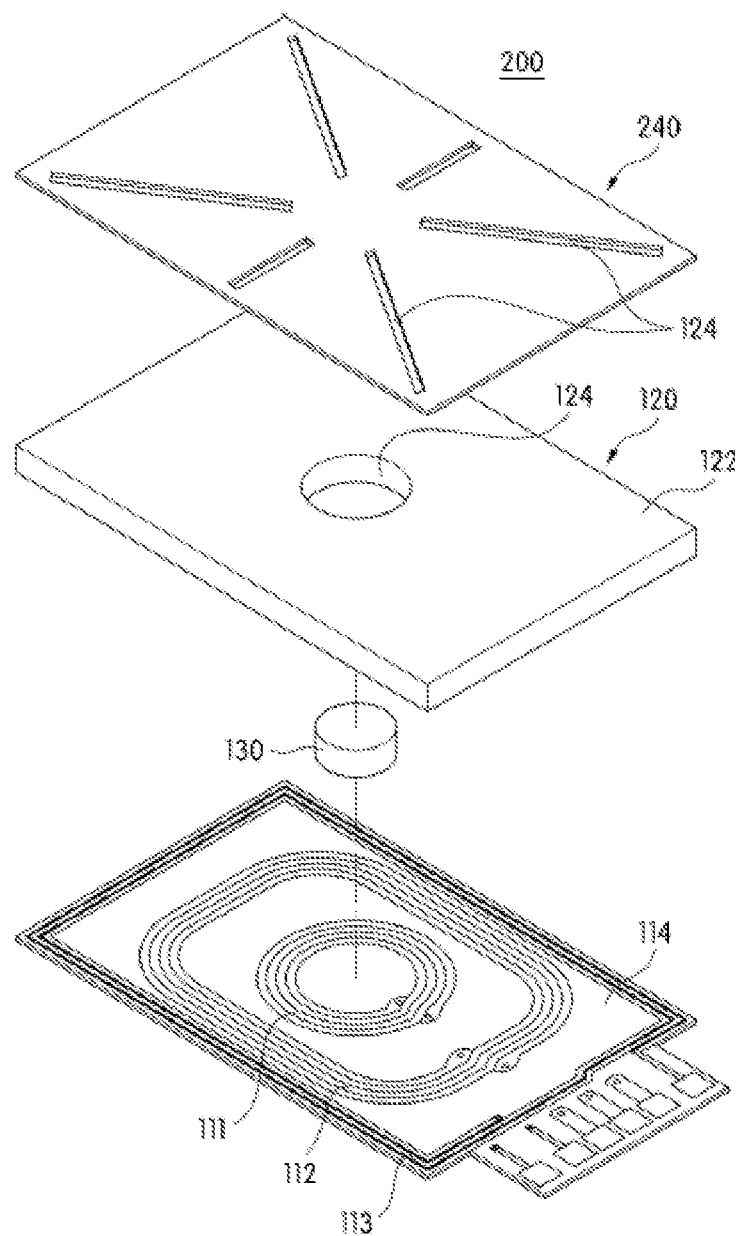
FIG. 5 is a schematic view of a shielding unit for the wireless power transfer module and the wireless power transfer module including the same according to another embodiment of the present invention.
Figure 6:
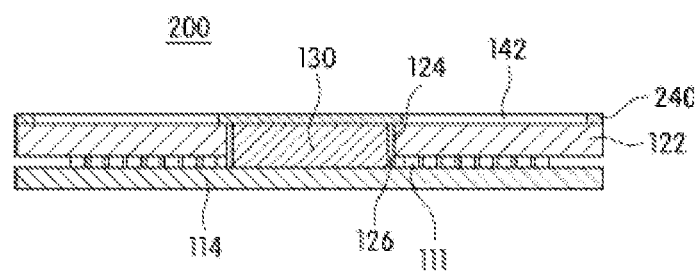
FIG. 6 is a cross-sectional view schematically illustrating the wireless power transfer module according to another embodiment of the present invention.
Figure 7A:
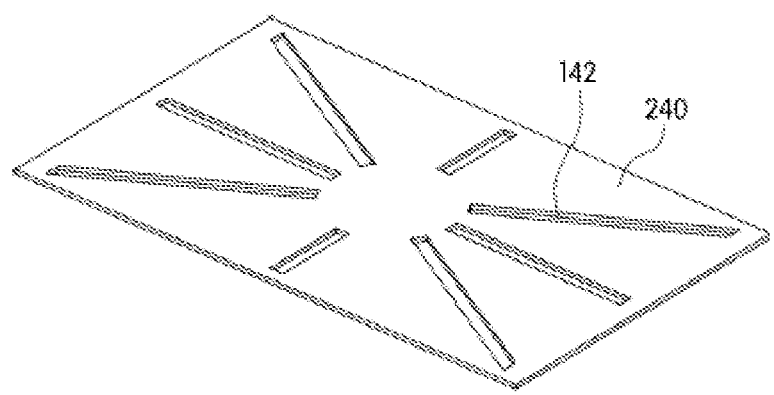
FIGS. 7A to 7D show various patterns formed on the metal sheet of FIG. 5.
Figure 7B:
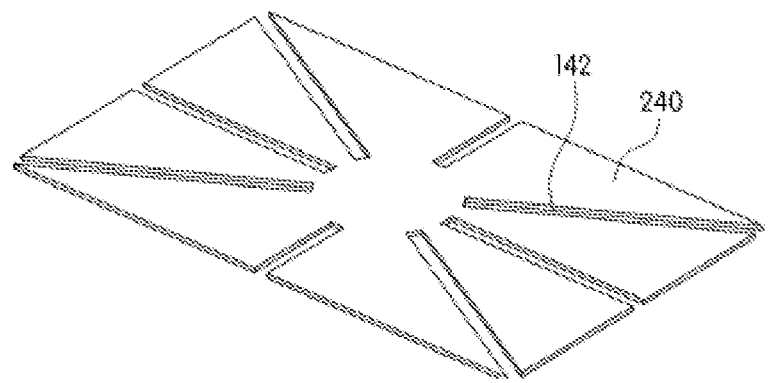
Figure 7C:
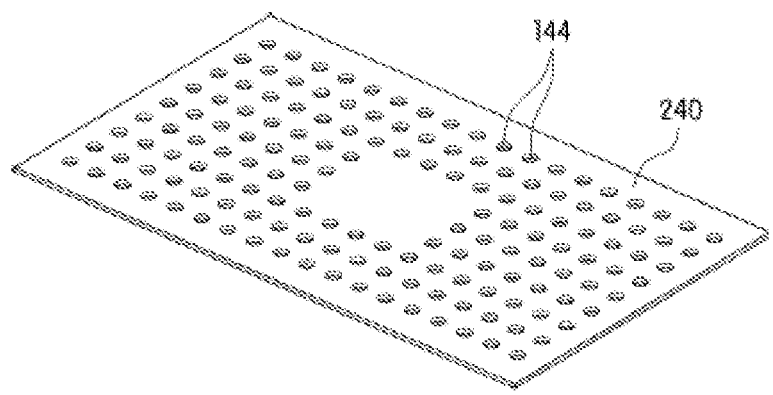
Figure 7D:
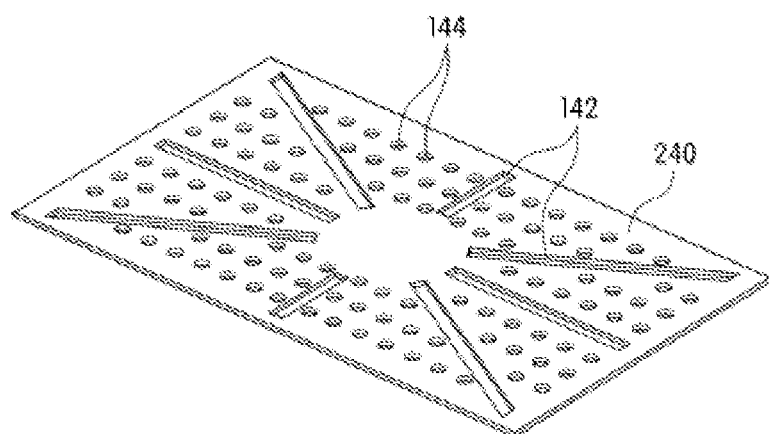

As shown in FIGS. 5 and 6, the supporting member 240 may be a metal sheet attached to the magnetic field shielding sheet 122 via an adhesive layer. That is, when the supporting member 240 is formed of a thin metal sheet having thermal conductivity, the supporting member 240 may have a function of discharging heat transferred from the heat source to the outside, and a function of protecting the magnetic field shielding sheet 122.

For example, the metal sheet may be formed of a thin metal plate having a thermal conductivity of 200 W/m·K or more, and may be an aluminum foil or a copper foil.

At this time, when the supporting member 240 is formed of a thin metal sheet, at least one pattern 142 or 144 may be formed through the supporting member 240 (refer to FIGS. 7A to 7D). By increasing the overall resistance of the supporting member 240, the pattern 142 or 144 may increase the charging efficiency by suppressing the generation of the eddy current during wireless charging using the wireless power.

The pattern 142 or 144 may be formed on the entire area of the metal sheet, or locally on a part of the area, formed in a predetermined pattern, or in a random pattern.

In addition, the pattern may be provided in the form of a slit 142 having a predetermined length or in the form of a through hole 144, or in a form in which the slit 142 and the through hole 144 are mixed.

Here, the slit may be provided in the form of a cut portion extending a predetermined length inward from the rim of the metal sheet. The slit may be provided in the form of a through hole penetrating the inside of the metal sheet. In addition, the slit may be provided in a combination of the cut portion and the through-hole.

The wireless power transfer module 100 or 200 may be installed inside the rear case 94 or the back cover 92 of the portable terminal 90 as shown in FIG. 9.

Figure 8:
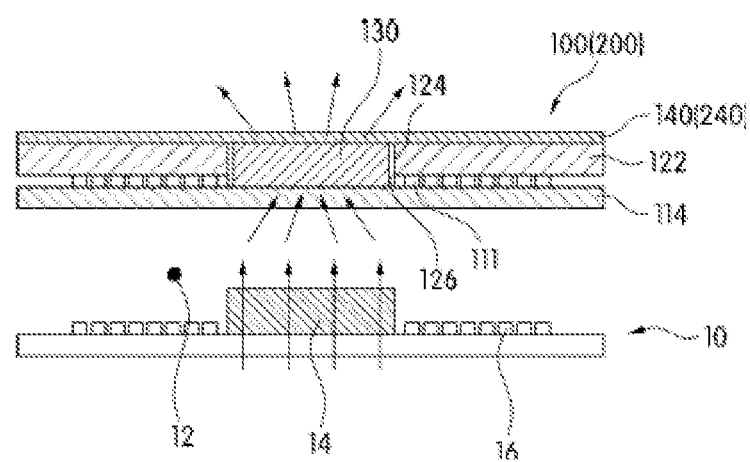
FIG. 8 is a schematic view showing a state in which a magnetic field generated from a permanent magnet in a wireless charging system employing the wireless power transfer module according to an embodiment of the present invention is induced by the magnetic body to prevent saturation of the shielding sheet.

As shown in FIG. 8, the wireless power transfer module 100 or 200 according to an exemplary embodiment of the present invention may include the wireless power transmission module 10 employing the permanent magnet and the wireless charging system 1 including the wireless power reception module 20.

For example, the wireless power transfer module 100 or 200 according to the present invention may serve as the wireless power reception module in the wireless charging system 1 employing the permanent magnet.

The wireless power transmission module 10 may supply power to the wireless power reception module 20 wirelessly when the wireless power reception module 20 approaches. The wireless power reception module 20 may charge the built-in battery of the portable terminal with the power supplied as described above.

In FIG. 8, reference numeral 14 may denote the hall sensor and the permanent magnet comprising the device for detecting the approach of the wireless power reception module 20, and reference numeral 16 may denote the wireless power transfer antenna.

Here, the hall sensor may be omitted when the wireless charging system 1 employing the permanent magnet operates in the Qi standard method. In addition, when the wireless charging system 1 employing the permanent magnet operates in the Qi standard method, the permanent magnet may be used for aligning the wireless power transmission module and the wireless power reception module through interaction with the magnetic body 130.

Meanwhile, although the wireless power transfer module 100 or 200 according to the present invention are applied to the PMA standard method and the Qi standard method in which the permanent magnet is employed in the wireless power transmission module 10, the present invention is not limited thereto. It should be noted that the present invention may be applied to other wireless charging methods in which the permanent magnet is employed in a wireless power transmission module 10.

As described above, the present invention has been described with respect to particularly preferred embodiments. However, the present invention is not limited to the above embodiments, and it is possible for one who has an ordinary skill in the art to make various modifications and variations, without departing off the spirit of the present invention.

What is claimed is:

1. A shielding unit for wireless power transfer module comprising:

a magnetic field shielding sheet which shields a magnetic field generated in predetermined frequency band and condense the magnetic field in a desired direction;

a magnetic body receiving portion formed through the magnetic field shielding sheet so that a magnetic body for inducing magnetic force lines generated from a permanent magnet is inserted, wherein a size of the magnetic body receiving portion has a larger than that of the magnetic body so that a gap is formed between the side surface of the magnetic body and the inner surface of the magnetic body receiving portion when the magnetic body is inserted, wherein the gap is formed entirely or partially along the circumferential direction of the magnetic body, wherein the magnetic body receiving portion is formed to have a larger cross-sectional area than the cross-sectional area of the permanent magnet, wherein the magnetic body is a separate piece separated from the magnetic field shielding sheet by a punching process to form the magnetic body receiving portion, wherein the magnetic field shield sheet includes a plate-type supporting member on a surface thereof, and the magnetic body is directly attached to the supporting member, wherein the supporting member is a thin metal sheet made of metal material, wherein the metal sheet includes at least one pattern formed through the metal sheet, and wherein the pattern includes at least one of a slit having a predetermined width and a length, and a through hole having a predetermined area, wherein the slit is not disposed on the magnetic body, and wherein the magnetic field shielding sheet and the magnetic body have the same material and the same thickness by using the punched portion as the magnetic body for inducing the magnetic force line generated from the permanent magnet.

2. The shielding unit for wireless power transfer module of claim 1, wherein the supporting member is a heat-radiating sheet or an adhesive member having an adhesive layer formed on at least one side thereof.

* * * * *